United States Patent
Cheong et al.

(10) Patent No.: US 8,057,856 B2
(45) Date of Patent: Nov. 15, 2011

(54) METHOD FOR GETTERING OXYGEN AND WATER DURING VACUUM DEPOSITION OF SULFIDE FILMS

(75) Inventors: Dan Daeweon Cheong, North York (CA); Paul Barry Del Bel Belluz, Guelph (CA); Stephen Charles Cool, Mississauga (CA); Abdul M. Nakua, Mississauga (CA); James Alexander Robert Stiles, Toronto (CA); Yong-seon Lee, Richmond Hill (CA); Terry Hunt, Alliston (CA); Vincent Joseph Alfred Pugliese, Oakville (CA)

(73) Assignee: Ifire IP Corporation, Oakville, Ontario (CA)

( * ) Notice: Subject to any disclaimer, the term of this patent is extended or adjusted under 35 U.S.C. 154(b) by 804 days.

(21) Appl. No.: 11/077,343

(22) Filed: Mar. 10, 2005

(65) Prior Publication Data

US 2005/0227005 A1 Oct. 13, 2005

Related U.S. Application Data

(60) Provisional application No. 60/552,717, filed on Mar. 15, 2004.

(51) Int. Cl.
*C23C 16/00* (2006.01)

(52) U.S. Cl. ......... 427/255.23; 427/64; 427/66; 427/69; 427/70; 427/157; 427/237; 427/250; 427/255.31; 427/569; 204/192.1

(58) Field of Classification Search ............. 427/255.31, 427/569, 64, 66, 69, 70, 157, 237, 250; 204/192.1, 204/192.15
See application file for complete search history.

(56) References Cited

U.S. PATENT DOCUMENTS

| | | | |
|---|---|---|---|
| 3,389,288 A | 6/1968 | Della Porta et al. | |
| 4,062,319 A | 12/1977 | Roth et al. | |
| 4,118,542 A | 10/1978 | Walter | |
| 5,432,015 A | 7/1995 | Wu et al. | |
| 5,508,586 A | 4/1996 | Martelli et al. | |
| 5,976,900 A | 11/1999 | Qiao et al. | |
| 6,241,477 B1 * | 6/2001 | Brezoczky et al. ............. 417/48 |
| 6,299,689 B1 | 10/2001 | Wang et al. | |
| 6,299,746 B1 | 10/2001 | Conte et al. | |
| 6,514,430 B1 | 2/2003 | Corazza et al. | |

(Continued)

FOREIGN PATENT DOCUMENTS

EP 0 656 430 * 6/1995

(Continued)

OTHER PUBLICATIONS

International Search Report, PCT/CA2005/000386, Mailed Jul. 7, 2005, Authorized Officer Michael M. Morgovsky.

*Primary Examiner* — Timothy Meeks
*Assistant Examiner* — Elizabeth Burkhart
(74) *Attorney, Agent, or Firm* — Fay Sharpe LLP

(57) ABSTRACT

The present invention is a method for gettering undesirable atomic species from a vaporizing atmosphere during deposition of multi-element thin film phosphor compositions. The method comprises vaporizing one or more getter species immediately prior and/or simultaneously during the deposition of a phosphor film composition within a deposition chamber. The method improves the luminance and emission spectrum of phosphor materials used for full colour ac electroluminescent displays employing thick film dielectric layers with a high dielectric constant.

19 Claims, 5 Drawing Sheets

U.S. PATENT DOCUMENTS

| | | |
|---|---|---|
| 6,586,878 B1 | 7/2003 | Tu |
| 2002/0081371 A1* | 6/2002 | Cheong ............................ 427/8 |
| 2004/0031977 A1* | 2/2004 | Brown et al. ................. 257/222 |
| 2005/0042376 A1* | 2/2005 | Xin et al. ................. 427/255.32 |

FOREIGN PATENT DOCUMENTS

| | | | |
|---|---|---|---|
| EP | 0 656430 B1 | | 6/1995 |
| EP | 0 656430 B2 | | 6/1995 |
| EP | 0656430 A1 | | 6/1995 |
| JP | 07-138739 | * | 5/1995 |
| WO | WO 02/23957 A1 | | 3/2002 |
| WO | WO 02/051960 A1 | | 7/2002 |
| WO | WO 02/097155 A1 | | 12/2002 |
| WO | WO 03027352 | * | 4/2003 |

* cited by examiner

METHOD FOR GETTERING OXYGEN AND WATER DURING VACUUM DEPOSITION OF SULFIDE FILMS

This application claims the benefit of U.S. Provisional Application Ser. No. 60/552,717, filed Mar. 15, 2004.

FIELD OF THE INVENTION

The present invention relates to a method for the deposition of multi element thin film compositions where the concentration of oxygen, water and other undesired atomic species is minimized. More specifically, the invention is a method for gettering oxygen, water and/or other undesired atomic species from a vaporizing atmosphere during the deposition of multi element phosphor film compositions. The method is particularly useful for the deposition of phosphors for full colour ac electroluminescent displays employing thick film dielectric layers with a high dielectric constant.

BACKGROUND TO THE INVENTION

Thick film dielectric structures are typically fabricated on ceramic substrates and provide superior resistance to dielectric breakdown, as well as a reduced operating voltage compared to thin film electroluminescent (TFEL) displays fabricated on glass substrates. When deposited on a ceramic substrate, the thick film dielectric structure withstands higher processing temperatures than TFEL devices on glass substrates. The increased tolerance to higher temperatures facilitates annealing of the phosphor films at higher temperatures to improve luminosity. However, even with the enhanced luminosity that is obtained, it is desirable to further increase the luminous efficiency of the devices to enable an improvement in overall energy efficiency and reduction in power consumption.

The Applicant has developed various methods for the deposition of phosphors used in thick film dielectric electroluminescent devices that are described for example in U.S. Pat. No. 5,432,015 (the entirety of which is incorporated herein by reference in its entirety). For example, International Patent Application PCT CA01/01823 (the disclosure of which is incorporated herein in its entirety) a method of electron beam vaporization for the deposition of a ternary, quaternary or similar phosphor composition, in which components of the composition are located on different sources. In particular, the compositions are thioaluminates, thiogallates or thioindates of Group IIA and Group IIB elements, and the sulfides that form such compounds are located on the different sources. The Applicant's International Patent Application PCT CA01/01234 (the disclosure of which is incorporated herein in its entirety) discloses a dual source phosphor deposition method using dual source electron beam deposition. The various compounds of the first and second sources are in the ratios required to provide the required composition of the phosphor. The deposited phosphors are preferably blue emitting europium activated barium thioaluminate ($BaAl_2S_4$:Eu). The Applicant's International Patent Application PCT CA02/00688 (the disclosure of which is incorporated herein in its entirety) discloses a single-source sputtering method for depositing controlled composition multi-element phosphor films. The method utilizes a source material in the form of a single dense target that has a composition different from the desired film composition of the phosphor. The concentrations of light chemical elements relative to heavier chemical elements in the target composition of the process is higher than desired in the deposited films.

In the deposition of phosphor compositions, it would be desirable to remove undesired chemical species from the deposition atmosphere in order to minimize the risk of such undesired chemical species from being incorporated into the deposited phosphor film. Getters are known materials that getter reactive gases in a variety of applications as is described for example in U.S. Pat. Nos. 4,062,319, 4,118,542, 5,508,586, 6,514,430 and 6,586,878.

U.S. Pat. No. 5,976,900 describes a pre-coat layer provided on interior surfaces of a process chamber that acts as a getter to mobile ions. The pre-coat layer is applied to the surfaces of the process chamber prior to any wafer processing.

U.S. Pat. No. 6,299,746 describes a getter system for purifying a gaseous atmosphere within a process chamber. The getter system comprises a planar getter device disposed within the process chamber.

U.S. Pat. No. 6,299,689 describes the use of a gettering material within a reflow chamber containing a shield that prevents the gettering material from reaching the material layer to be reflowed.

While the aforementioned patents disclose the use of getter materials, it is desirable to provide an improved method for gettering undesirable atomic species during deposition of phosphor compositions for use in thick film dielectric electroluminescent displays in order to further improve luminance and luminous efficiency of the phosphor compositions.

SUMMARY OF THE INVENTION

The invention is a method for minimizing and reducing the amount of oxygen, water and/or other undesirable atomic species from a vaporizing atmosphere within a deposition chamber where a phosphor composition is being deposited on a substrate. As such, the method is useful in minimizing and reducing the amount of oxygen, water and/or other undesirable atomic species from being deposited on and/or within the phosphor composition.

The method comprises providing a getter species that is volatilizable or vaporizable using evaporation or sputtering techniques in order to form a gettering film on the inner walls of the deposition chamber to getter undesirable atomic species that may be vaporized during deposition of a phosphor film composition on a substrate. The getter species is volatilized immediately prior or simultaneously with the deposition of a phosphor film composition. In the method of the invention, undesirable atomic species are not or minimally co-volatilized and therefore are not or minimally incorporated into the depositing phosphor composition.

According to an aspect of the invention is a method for minimizing the production of undesirable atomic species within a deposition chamber where the deposition of a phosphor film composition is effected on a substrate, the method comprising:

vaporizing one or more getter species immediately prior and/or simultaneously during the deposition of a phosphor film composition within said deposition chamber, wherein said vaporization continuously provides getter species that getter undesirable atomic species within said chamber during deposition of said phosphor film composition.

According to an aspect of the present invention is a method for minimizing the production and deposition of water, oxygen and/or other undesirable atomic species within a deposition chamber where the deposition of a phosphor film composition is effected on a substrate, the method comprising:

vaporizing one or more getter species immediately prior and/or simultaneously during the deposition of a phosphor film composition within said deposition chamber, wherein said vaporization continuously getters said water, oxygen and/or other undesirable atomic species within said chamber.

According to yet another aspect of the present invention is a method that in-situ supplies a high surface area getter film within a vacuum deposition chamber for phosphor film composition deposition, the getter species making up the getter film is provided at a rate commensurate with the generation of undesirable species to be absorbed.

According to another aspect of the present invention, there is provided a vapor deposition method for the deposition of a thin film pre-determined phosphor composition onto a substrate within a deposition chamber, the composition comprising ternary, quaternary or higher sulfide compounds selected from the group consisting of thioaluminates, thiogallates and thioindates of at least one element from Groups IIA and IIB of the Periodic Table, the method comprising:

volatilizing one or more getter species adjacent at least one source comprising a sulfide that forms said pre-determined composition, wherein said getter species is continuously deposited on internal surfaces of said deposition chamber.

According to yet another aspect of the present invention, there is provided a vapor deposition method for the deposition of an europium activated barium thioaluminate or europium activated calcium thioaluminate phosphor composition on a substrate within a vapor deposition chamber, the method comprising:

(a) volatilizing one or more sources that collectively comprise the phosphor composition; and (b) immediately prior to (a) or simultaneously to (a) volatilizing a compact low surface area source of getter species such to provide a high surface area getter film within a substantial portion of the internal-surface area of the deposition chamber to remove and minimize undesirable vapor species from the deposition chamber and minimize their incorporation in said phosphor composition.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the detailed description given herein and from the accompanying drawings, which are given by way of illustration only and do not limit the intended scope of the invention.

DETAILED DESCRIPTION OF THE INVENTION

Figure 1A:
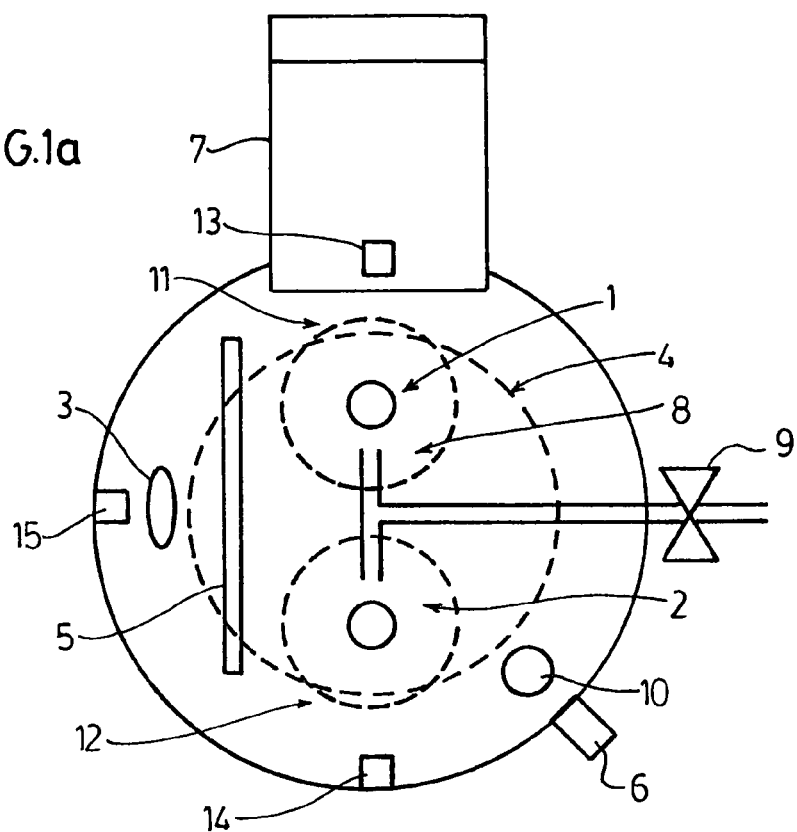
FIGS. 1A and 1B are schematic diagrams showing a top (plan) view (IA) and side view (IB) of a phosphor deposition chamber in accordance with the present invention.

The present invention is a method for controlling and minimizing the amount of oxygen, water and/or other undesirable vapor species in a vapor deposition atmosphere in order to minimize their incorporation into a phosphor composition during deposition of the phosphor composition. The present method incorporates one or more getter species that are vaporized to provide a getter film on the internal walls of a deposition chamber prior and/or during deposition of the phosphor composition. The getter film may be provided immediately prior to deposition of the phosphor composition and/or is continuously provided during the time period for which the phosphor composition is deposited on the substrate. It is understood by one of skill in the art that the continuous provision of a getter film is synonymous with providing such a film progressively, successively, deliberately and without substantial interruption.

The method in-situ supplies a high surface area getter film within a vacuum deposition chamber for phosphor film composition deposition at a rate commensurate with the generation of undesirable vapor species to be absorbed. The invention overcomes the limited ability of fixed-capacity getters to absorb undesirable vapor species and to absorb vapor species at a diminishing rate as the deposition process proceeds. The invention also overcomes the problem of getter deactivation when the vacuum deposition chamber is opened, thereby allowing ingress of oxygen and water vapor from the ambient environment to saturate the getter. The invention further overcomes the problem of fixed getter materials being covered up and thus deactivated by species of the phosphor composition as the phosphor is deposited.

The vapour deposition method of the invention is particularly useful for the deposition of phosphor compositions onto substrates where the phosphor compositions are selected from the group consisting of thioaluminates, thiogallates and thioindates of at least one element from Groups IIA and IIB of the Periodic Table having a controlled sulfur content. The source materials from which the desired phosphor composition is deposited include those selected from metals, alloys, intermetallic compounds, sulfides and sulfur-containing vapors that collectively contain the elements comprising the deposited phosphor film composition. In embodiments of the invention, the deposited thin film composition comprises an europium-activated barium thioaluminate phosphor composition or europium-activated calcium thioaluminate phosphor composition. Using the method of the present invention, phosphors with a high luminosity and useful emission color are obtained.

In the method, one or more source materials that make up the composition of the deposited phosphor are deposited onto a suitable substrate using for example, low pressure physical vapor deposition methods such as electron beam evaporation, thermal evaporation or sputtering. These physical vapor deposition methods are well known to those of skill in the art. The relative volatilization of the source materials is controlled to obtain the desired ratio of metal species on the deposition substrate. The temporal variation of deposition of the components onto the substrate from the source or sources used that form the deposited phosphor composition may be monitored and controlled to effect simultaneous vapor deposition from the source or sources as taught in the Applicant's International Patent Application PCT CA01/01823 (the disclosure of which is incorporated herein by reference in its entirety). A getter species or material is provided adjacent the source(s) in order to remove, prevent or minimize any excess sulfur species, oxygen, water or other undesirable atomic species from being vaporized and thus depositing on the deposition substrate and thus into the deposited phosphor composition. The getter species is vaporized (or volatilized) substantially adjacent the source(s) and is deposited over (i.e. condensed onto) forming a high surface area getter film on a substantial fraction of the internal surfaces of the deposition chamber that presents a direct line of sight to undesirable atomic species introduced into the deposition chamber so that there is a high probability of the undesirable atomic species molecules being trapped (i.e. gettered) and immobilized when it contacts the chamber surfaces. Undesirable vapor atomic species is understood to include but not be limited to oxygen, water, excess sulfur, carbon dioxide, carbon monoxide, sulfur monoxide, sulfur dioxide, molecular nitrogen and other hydrogen-bearing molecules. The method of the invention is suitable for use with any standard type of vapor deposition chamber as is understood by one skilled in the art.

It is understood by one of skill in the art that one or more getter species may be provided within the deposition chamber in the method of the present invention. It is desirable to provide the one or more getter species substantially adjacent to the one or more sources that make up the composition of the deposited phosphor composition. Suitable getter species for use in the present invention include but are not limited to barium metal; barium aluminum alloy; barium metal passivated with a thin oxide, sulfate or sulfide surface layer; titanium metal; titanium sponge; titanium-containing alloy, other getter materials as generally known in the gettering art and combinations thereof. The getter species is provided as a pellet or target that is vaporizable or sputterable within the vapor deposition chamber. It is understood that the getter species provided as a pellet may also be provided as "loose chunks" of getter species for evaporation thereof. Thus, the invention encompasses the use of pellets, chunks and targets of getter species for vaporization/volatilization thereof.

In an embodiment of the invention the getter species is supplied by thermally evaporating barium metal or a barium aluminum alloy from a barium or barium aluminum alloy pellet. For ease of handling the barium aluminum pellet may comprise the intermetallic compound $BaAl_4$ where the barium is sequestered within the crystal structure of the compound to render it sufficiently inert in air that it can be easily handled without oxidation. When the pellet is heated a barium vapor is emitted and condenses on the walls of the deposition chamber to form a high surface area getter film to maximize the efficiency of the getter in removing undesirable vapor species from the deposition chamber. The barium is evaporated at a rate commensurate with the generation of oxygen, water vapor or other undesirable atomic species such that such undesired atomic species are/is absorbed into or reacted with the getter species. Oxygen and/or water vapor may be generated from sources used for phosphor film deposition as a contaminant when hydrogen sulfide is injected into the deposition chamber to maintain an adequate sulfur pressure to form the desired sulfide phosphor films.

The method of the invention generates a high surface area getter film in the deposition chamber from a low surface area source of getter material that can be readily handled in the ambient atmosphere so it can be prepared and positioned in the deposition chamber without chemical degradation due to reaction with oxygen, water and/or other vapor species that may be contained in the ambient atmosphere. Once the chamber is evacuated prior to deposition, the low surface area getter species can be transformed into a high surface area getter film by a process of volatilization/vaporization and re-condensation on the deposition chamber surfaces using physical vapor deposition techniques. This can be done before and/or during deposition of the phosphor film composition.

The getter film should cover a substantial portion of the internal surfaces of the deposition chamber in order to be effective in scavenging undesirable vapor species from the deposition chamber. To quantify the requirement, it is noted that at deposition chamber temperatures at or above ambient temperature, the mean thermal velocity v of a vapour molecule is given by the formula $v=(3\ kT/M)^{1/2}$ where k is the Boltzmann constant, T is the absolute temperature and M is the mass of the vapour molecule. For vapour molecules at normal ambient temperature, this velocity falls between about 100 meters per second for heavy molecules to about 2000 meters per second for hydrogen molecules. For low vacuum pressures typically used in vapor deposition processes, the mean free path of vapor molecules is typically greater than 1 meter, so the collisions involving vapor molecules are primarily those with the chamber surfaces for a typical chamber dimension of about 1 meter. Correspondingly, the frequency of collisions between a single vapor molecule and the chamber surfaces is in the range of 100 Hz to 1000 Hz. Therefore for a typical 10 minute deposition, there may be between 60,000 and 600,000 collisions between a thermalized vapor. molecule and the chamber surfaces during the deposition if it is not gettered by the method of the present invention. The probability of the vapor molecule being gettered by the surface is proportional to the fraction of surfaces covered by an effective getter times the probability of being captured by the getter in a single collision. With the assumption that the probability of being captured by the getter in a single collision is 100%, the fraction of chamber surfaces covered by the getter needs to be at least 1/60,000 or about $2\times10^{-5}$ steradians to getter most of the vapor species in a time comparable to the deposition time. This translates into a required getter area of at least about 2 $cm^2$ in an approximately spheroidal chamber with a radius of one meter. If the probability of a vapor molecule being gettered in a single collision is 50%, and it is desired to reduce the concentration of the vapor by a factor of 1000 in a time comparable to the deposition time, then at least 10 collisions per molecule are required, and the required getter area is at least 20 $cm^2$. Continuing in a similar vein, if the probability of a vapor molecule being gettered in a single collision is 30%, and it is desired to reduce the concentration of the vapor concentration by a factor of 10,000 then the required getter area is about 150 $cm^2$. One skilled in the art can further extend the calculations as required and desired.

Typically a deposition chamber has inner surfaces which also may include removable shields to facilitate chamber cleaning and other removable shields to manage the chamber temperature distribution or control the direction of vapor emitted from deposition source(s). Getter films coating these surfaces as provided by the method of the invention are most effective in gettering unwanted vapor atomic species since they present the highest collision probability for the vapor molecules. Therefore it is desirable to control the getter deposition process to maximize the proportion of getter material that deposits as a getter film on these surfaces. Generally these inner surfaces are at a higher temperature than the outer chamber walls. Typically, the getter species will not condense on surfaces that are at a temperature for which the saturation vapor pressure exceeds the actual vapor pressure of the vaporized getter. Therefore the temperature of the surface on which getter condensation is required should be suitably low. If the temperature of that surface is below that of the outer walls of the chamber, and if there is a direct line of sight between that surface and the source of volatilized getter film, the majority of the getter will condense there.

In an embodiment of the invention, a thermal barium-containing getter material is placed such that the thin film deposition substrate is shielded by direct line of sight from the material so that there is no substantial deposition of barium on the deposition substrate. However, in aspects of the invention, it may also be desirable in the deposition of barium-containing films to have barium from the thermal getter material deposited both on the walls of the deposition chamber to function as a getter and on the deposition substrate to contribute barium to the chemical composition of the deposited film.

In still a further embodiment of the invention, the barium-containing getter species may be barium metal passivated with a thin oxide, sulfate or sulfide surface layer to facilitate handling of the getter pellets in air to enable loading of the pellets in the deposition chamber.

In yet still another embodiment of the invention, the getter species may be titanium metal sputtered from a target that comprises titanium or a titanium-containing alloy. If titanium is not desired in the deposited film, the titanium source should be placed so that there is not a direct line of sight between the source and the deposition substrate.

The getter species for evaporation or sputtering should be positioned so there is a line-of-sight between the getter species evaporation or sputtering and the surfaces onto which the getter is to be deposited during phosphor deposition. Further, if the getter species are not desired as part of the deposited phosphor composition, then the getter species for evaporation or sputtering should be positioned so that there is not a direct line-of-sight between the getter species and the deposition substrate. Also, the substrate may be maintained at a higher temperature than that of the surface where the getter species is to be deposited to minimize the condensation of getter species on the deposition substrate.

Figure 2:
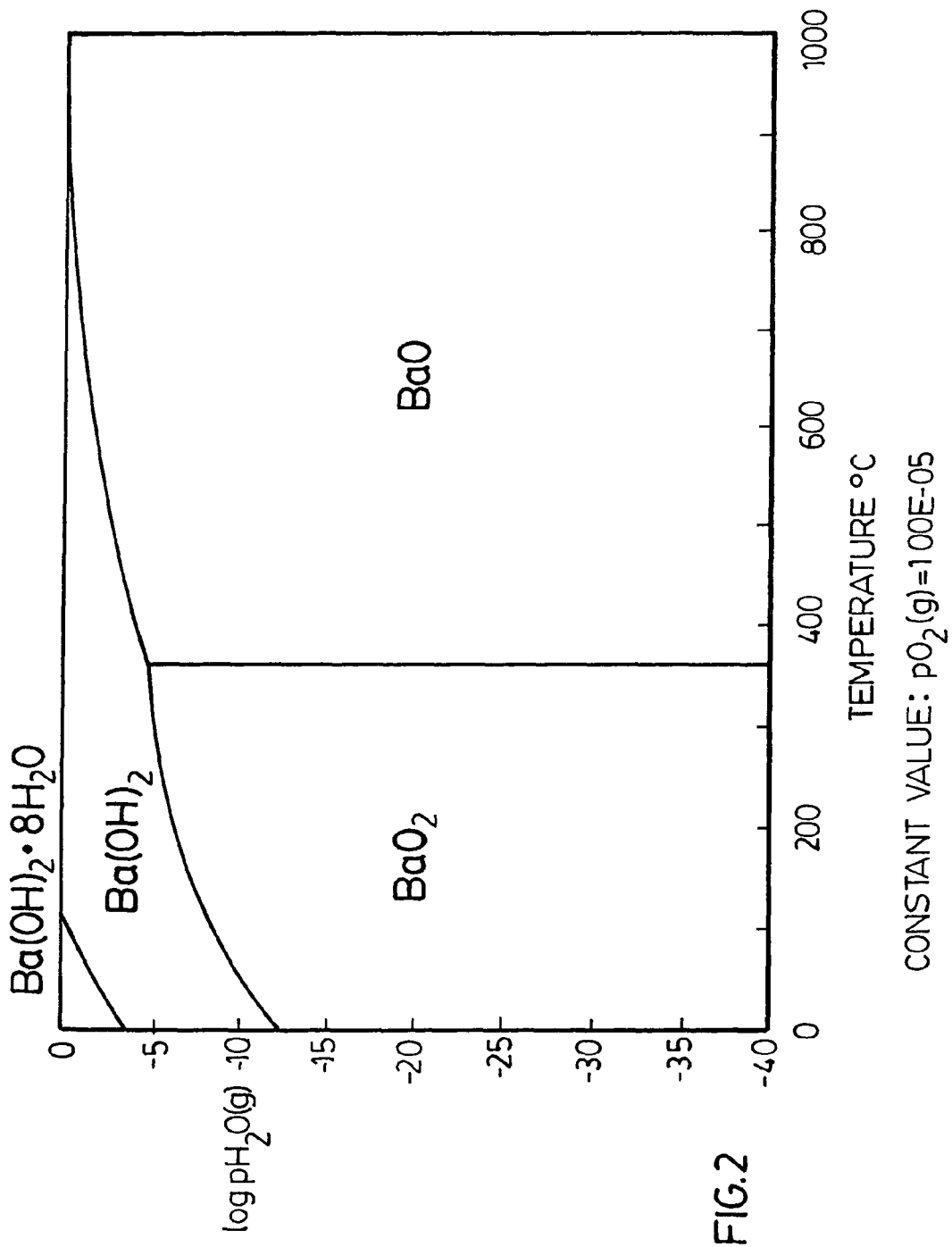
FIG. 2 is a diagram showing the predominant chemical compounds that form from barium, oxygen and hydrogen at specified oxygen and water vapor partial pressures and temperatures.

For embodiments using a barium-containing getter material, the barium may getter oxygen and/or water and hydrogen depending on the temperature of the deposited barium-containing film. FIG. 2 shows the predominant compounds that form in chemical equilibrium from barium, oxygen and hydrogen as a function of oxygen and water vapor partial pressures and of temperature. The partial pressure of water $pH_2O$ is given as $\log_{10}(pH_2O)$ in units of atmospheres and the temperature is given in degrees Celsius. As can be seen from the figure, barium hydroxide and hydrated barium hydroxide are the predominant compounds at water vapor partial pressures typical of the vacuum deposition atmosphere and at a temperature near normal ambient temperature. In this range of conditions both water and oxygen should be effectively gettered by barium metal to form these compounds. At lower water partial pressures and in the same temperature range the predominant compound is $BaO_2$, indicating that oxygen may be effectively gettered, but the water, if it is gettered will release hydrogen by reaction with the barium to form $BaO_2$. Similarly at higher temperatures, BaO may be formed by reaction of barium with water to release hydrogen.

Figure 3:
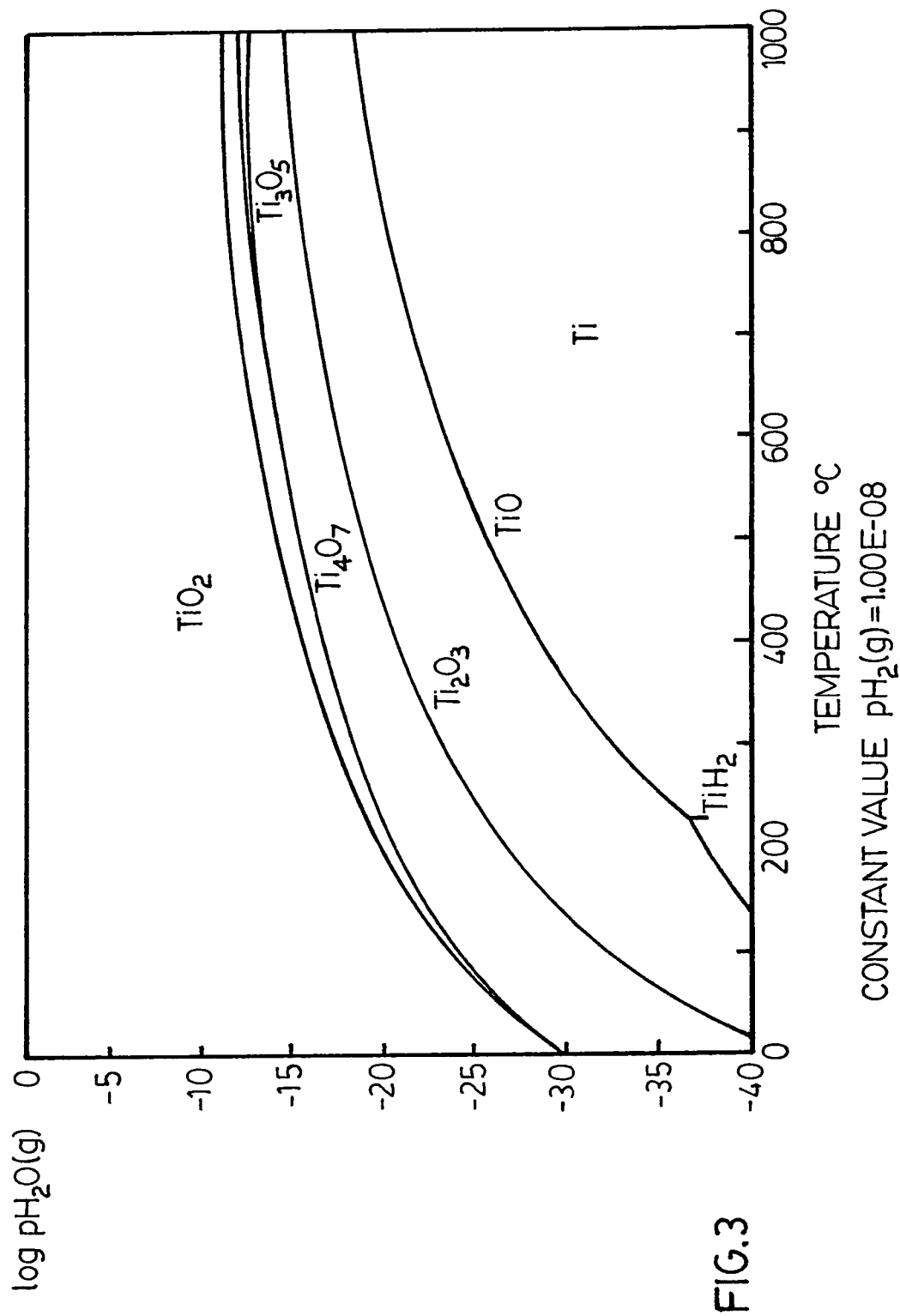
FIG. 3 is a diagram showing the predominant chemical compounds that form from titanium, oxygen and hydrogen at specified oxygen and water vapour partial pressures and temperatures.

For embodiments of the invention using a titanium getter species, oxygen may be gettered to form a titanium oxide, but no hydroxides are reported to form to facilitate simultaneous gettering of oxygen and hydrogen or water. This is illustrated in the predominance diagram shown in FIG. 3.

The present invention provides for the deposition of thin film phosphors comprising rare earth activated thioalumi- nates achieving high energy efficiency and high luminosity. The method can be used to deposit phosphors in the form of ternary or quaternary compounds keeping the ratio of the three or four, or more, constituent elements controlled to close tolerances to achieve optimum phosphor performance and to reduce the likelihood that the phosphor material may form into more than one crystal phase. Furthermore, the method is such to ensure that the concentration of impurities such as oxygen are kept to a minimum.

The method of the invention is applicable to thin film phosphors with the range of phosphor compositions listed above incorporated into a thick film dielectric electroluminescent display as taught for example in Applicant's U.S. Pat. No. 5,432,015 (the disclosure of which is incorporated herein in its entirety). The phosphor compositions may be activated with a variety of dopants such as for example europium and cerium.

Stoichiometry of the deposited phosphor compositions may be controlled as disclosed in the Applicant's PCT CA01/01823 (the disclosure of which is incorporated herein by reference in its entirety). Control of stoichiometry during deposition is effected using two or more deposition sources with different chemical compositions, together with a deposition rate measuring system for at least two of the sources that measures the deposition rate for these sources independently from the deposition rate of the remaining source materials and a feedback system that controls the relative deposition rates commensurate with the measured rates.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLE 1

Figure 1B:
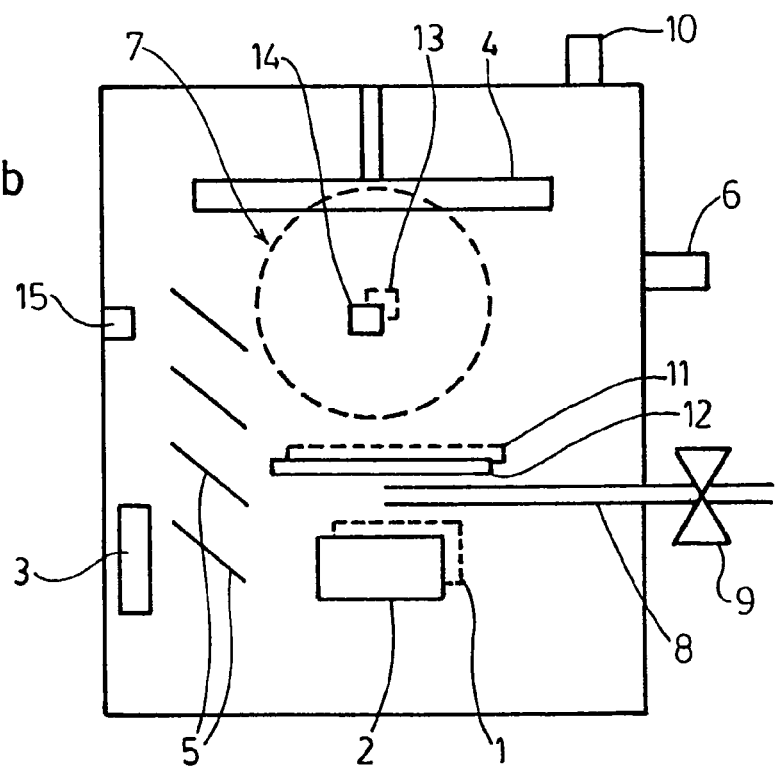

With reference to the schematic cross section diagram of FIG. 1, a modified Davis and Wilder 10SC-2836 vacuum deposition system was fitted with an electron beam sources for barium sulfide doped with 6 atomic percent europium measured with respect to the atomic barium concentration (1) and an electron beam source for aluminum sulfide (2). A thermal source was provided for evaporation of barium aluminum ($BaAl_4$) (3). A heated deposition substrate (4) was provided above the sources. A louvered shield (5) was provided to prevent a direct line-of-sight between the thermal; source and the deposition substrate, yet still allow deposition of barium aluminum on a portion of the chamber walls to act as a getter film during evaporation of materials from the electron beam sources to form a thin film phosphor on the deposition substrate. A residual gas analyzer (6) was connected to the vacuum chamber to monitor vapor species in the chamber. A pumping port (7) was provided to evacuate the chamber using a diffusion pump and an injection line (8) with a control valve (9) is provided to inject hydrogen sulfide into the chamber at both the surface of the doped barium sulfide source material (1) and at the surface of the aluminum sulfide source material (2) at a controlled rate commensurate with the desired operating pressure during deposition of the thin film in accordance with methods described in Applicant's U.S.

Provisional Patent Application Ser. No. 60/484,290 (the disclosure of which is incorporated herein by reference in its entirety).

An ion gauge (10) was provided to measure the pressure in the chamber. A shutter (11) was positioned in front of the europium doped barium sulfide electron beam source (1) to prevent deposition of the doped barium sulfide on the deposition substrate while it was being heated up and a second shutter (12) was positioned in front of the aluminum sulfide electron beam source (2) to prevent deposition of the aluminum sulfide on the deposition substrate while it was being heated up. A quartz crystal monitor (13) was provided to monitor the deposition rate of the doped barium sulfide, a second quartz crystal monitor (14) was provided to monitor the deposition rate of aluminum sulfide and a third quartz crystal monitor (15) was provided to monitor the deposition rate of getter material prior to deposition of the phosphor film.

The chamber was loaded with the doped barium sulfide and aluminum sulfide source materials. The chamber was pumped to a base pressure of 0.1 mPa and the deposition substrate was heated to 325° C. The shutters (7) were placed in their closed position and power was applied to the two electron beam sources (2) and (3) with the emission current increased slowly over about 25 minutes to a maximum current of 160 mA (at 4.7 kV) on the $Al_2S_3$ source, and 85 mA (at 6.0 kV) on the europium doped barium sulfide source, so that the temperature of the source materials increased uniformly. Once full power was reached, the shutters were opened to initiate deposition of phosphor material onto the heated substrate. For this deposition, the thermal source (3) was not used and was not heated.

Figure 4:
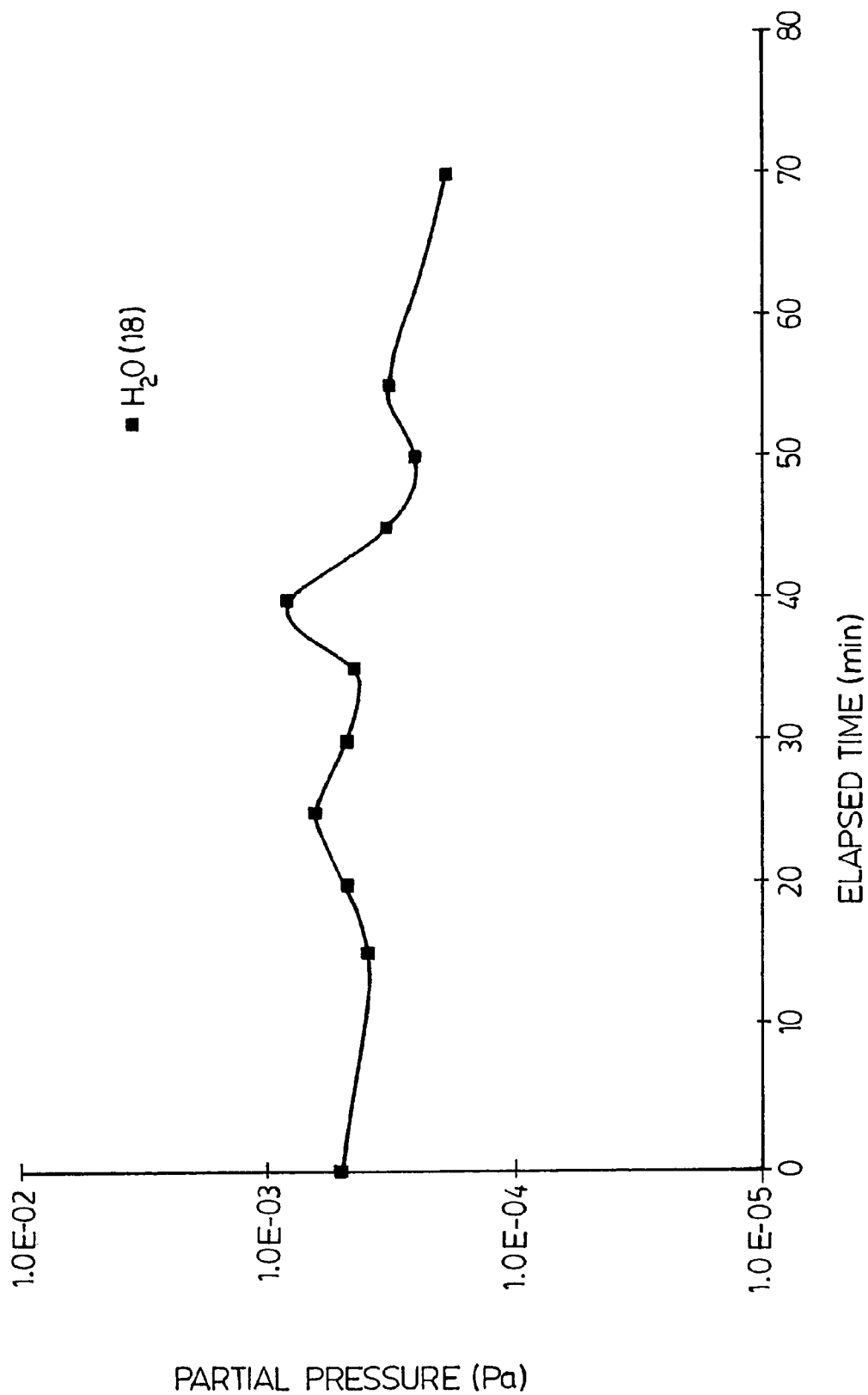
FIG. 4 is a graph showing the concentration of vapor species prior to and during phosphor deposition without the use of the getter material of this invention.
Figure 5:
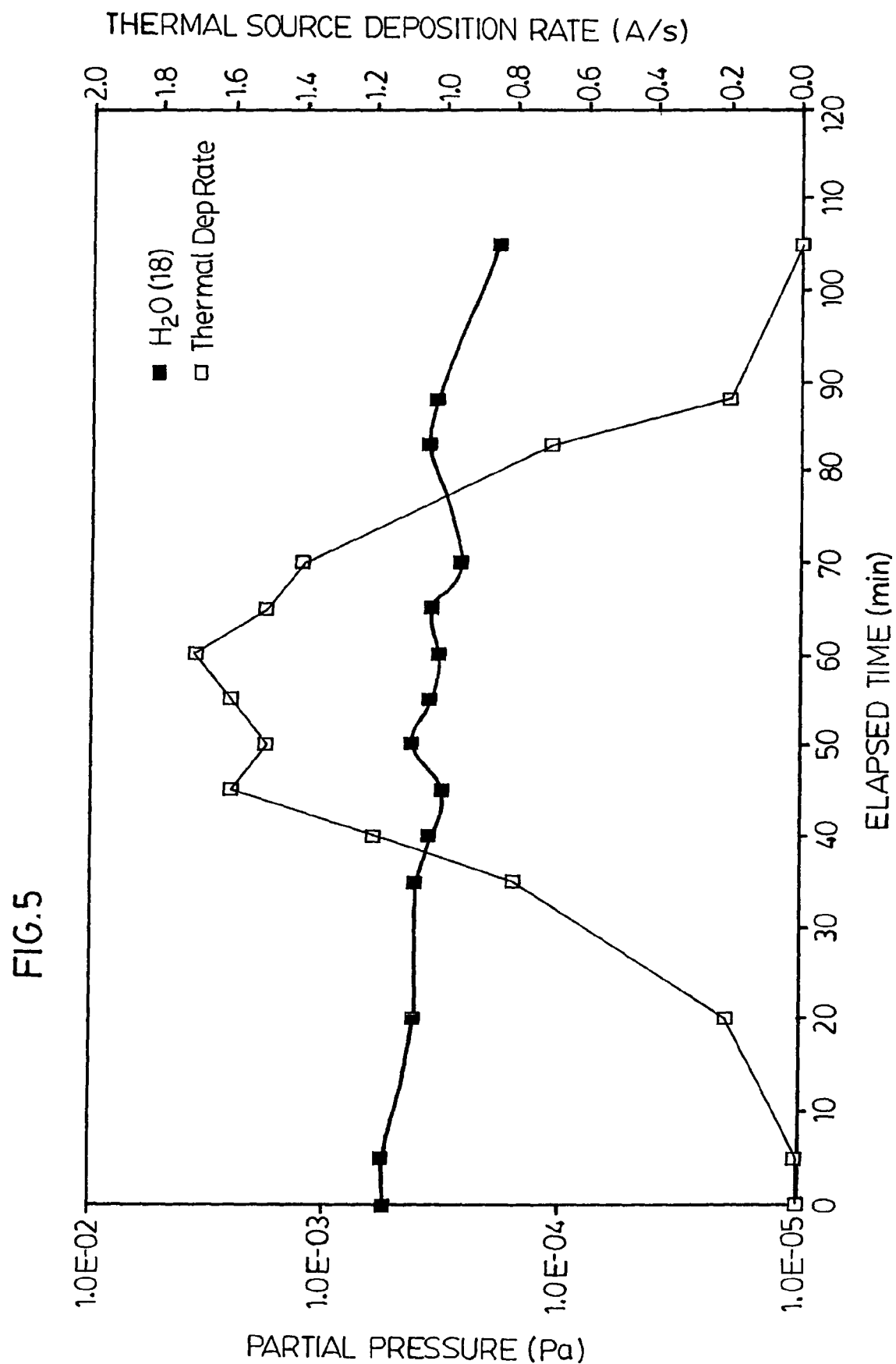
FIG. 5 is a graph showing the concentration of vapor species prior to and during phosphor deposition with the use of the getter species and methods of this invention.

FIG. 4 shows the relative concentrations of vapor species measured while the source materials were heated and during the phosphor deposition. As can be seen from the data, the concentrations of nitrogen, water and hydrogen increased as the source materials were heated. The partial pressure of water vapor prior to source material heating was about $5 \times 10^{-4}$ Pa as measured by the residual gas analyzer. It rose to about $8 \times 10^{-4}$ Pa immediately upon completion of the source material heating and then fell back again to $5 \times 10^{-4}$ Pa. The rise during heating is attributed to out-gassing of the source materials when they melted. When the deposition was begun, the water vapor pressure rose to $1.2 \times 10^{-3}$ Pa and then dropped somewhat to $9 \times 10^{-4}$ Pa as the deposition proceeded. When the shutters were closed following deposition, the water vapor pressure dropped to about $6 \times 10^{-4}$ Pa. It dropped further as the power to the sources was switched off and the sources cooled.

EXAMPLE 2

A vacuum deposition similar to that of Example 1 was carried out using the thermal source (3) containing the intermetallic compound $BaAl_4$. The $BaAl_4$ placed in the alumina source crucible was in the form of small chunks approximately 2 to 3 millimeters in size. Heating of the thermal source (3) began about 10 to 15 minutes from the beginning of the initial pump-down of the vacuum chamber. The rate of vaporization of the $BaAl_4$ was measured using the quartz crystal monitor (15). The power to the thermal source was increased until the deposition rate was in the range of 1 to 3 Angstroms per second. When the power to the electron beam sources (2) and (3) was then applied and increased, the water vapor pressure measured by the residual gas analyzer rose only to $3 \times 10^{-4}$ Pa and when the deposition was started following opening of the shutters the water vapor pressure rose only to a value within the range $3 \times 10^{-4}$ Pa to $4 \times 10^{-4}$ Pa, a factor of about 3 less than for Example 1, showing the efficacy of the getter in reducing the water vapor pressure.

Although preferred embodiments of the invention have been described herein in detail, it will be understood by those skilled in the art that variations may be made thereto without departing from the spirit of the invention or the scope of the appended claims.

The invention claimed is:

1. A reactive sputtering method for minimizing the production of undesirable atomic species within a single deposition chamber where the deposition of a phosphor film composition is effected on a substrate, the reactive sputtering method comprising:

vaporizing one or more getter species simultaneously with the deposition of said phosphor film composition within said single deposition chamber, while adding hydrogen sulfide process gas, wherein said vaporization continuously provides getter species that getter undesirable atomic species, including at least water, oxygen, and excess sulfur, from within said chamber during deposition of said phosphor film composition to ensure that the same are not incorporated into the phosphor film, the vaporized getter being condensed in the deposition chamber at a location that is different from the location of the deposition substrate, such that the phosphor film has a predetermined composition comprising ternary, quaternary or higher sulfide compounds selected from the group consisting of thioaluminates, thiogallates and thioindates of at least one element from Groups IIA and IIB of the Periodic Table.

2. The method of claim 1, wherein said getter species are vaporized and condensed onto internal surfaces of said deposition chamber.

3. The method of claim 2, wherein said getter species are vaporized and condensed onto the internal surfaces of said deposition chamber that present a direct line of sight to said undesirable atomic species.

4. The method of claim 2, wherein said internal surfaces of said deposition chamber is maintained at a temperature that is lower than outer walls of said deposition chamber.

5. The method of claim 2, wherein said getter species are further deposited on said substrate.

6. The method of claim 5, wherein said getter species is barium containing.

7. The method of claim 6, wherein said phosphor film composition comprises barium.

8. The method of claim 1, wherein said getter species are vaporized and condensed onto removable shields provided within said deposition chamber.

9. The method of claim 1, wherein said getter species is a target sputtered within said deposition chamber.

10. The method of claim 1, wherein said getter species is selected from the group consisting of barium metal, barium aluminum alloy, barium metal passivated with a thin oxide, sulfate or sulfide surface layer, and combinations thereof.

11. The method of claim 10, wherein said undesirable atomic species are selected from the group consisting of oxygen, water, excess sulfur, carbon dioxide, carbon monoxide, sulfur monoxide, sulfur dioxide, molecular nitrogen and other hydrogen-bearing molecules.

12. The method of claim 1, wherein said substrate is provided at a higher temperature than that of said internal surfaces of said deposition chamber.

13. The method of claim 1, wherein said phosphor film composition comprises an europium-activated barium thioaluminate.

14. The method of claim 1, wherein said phosphor film composition comprises an europium-activated calcium thioaluminate phosphor composition.

15. The method of claim 1, wherein said getter species is vaporized substantially adjacent sources being vaporized that make up the composition of said phosphor film.

16. The method of claim 1, wherein said vaporization of said getter species is effected at a rate commensurate with the generation of undesirable species to be absorbed.

17. A reactive sputtering method for minimizing the production and deposition of water, oxygen and other undesirable atomic species within a single deposition chamber where the deposition of a phosphor film composition is effected on a substrate, the reactive sputtering method comprising:

vaporizing one or more getter species simultaneously during the deposition of a phosphor film composition within said single deposition chamber with the addition of hydrogen sulfide, wherein said vaporization continuously getters said water, oxygen and other undesirable atomic species within said chamber while depositing said phosphor film composition, which has a predetermined composition comprising ternary, quaternary, or higher sulfide compounds selected from the group consisting of thioaluminates, thiogallates and thioindates of at least one element from Groups IIA and IIB of the Periodic Table.

18. A reactive vapor deposition method for the deposition of a thin film predetermined phosphor composition onto a substrate within a single deposition chamber, the composition comprising ternary, quaternary or higher sulfide compounds selected from the group consisting of thioaluminates, thiogallates and thioindates of at least one element from Groups IIA and IIB of the Periodic Table, the reactive method comprising:

volatizing one or more gettering species adjacent at least one source comprising a sulfide that forms said predetermined composition, wherein said gettering species is continuously deposited on internal surfaces of said single deposition chamber with the addition of hydrogen sulfide and water, oxygen, excess sulfur and other undesirable atomic species are removed while the phosphor film having the predetermined phosphor composition including sulfur is deposited.

19. A reactive vapor deposition method for the deposition of an europium activated barium thioaluminate or europium activated calcium thioaluminate phosphor composition on a substrate within a single vapor deposition chamber, the reactive method comprising:

(a) volatilizing one or more sources that collectively comprise the phosphor composition; and (b) simultaneously volatilizing one or more compact low surface area getter species with the addition of hydrogen sulfide such to provide a high surface area getter film within a substantial portion of the internal surface area of the single deposition chamber to remove and minimize water, oxygen, and other undesirable vapor species from the single deposition chamber and minimize their incorporation in said phosphor composition.

\* \* \* \* \*